United States Patent
Chang et al.

[11] Patent Number: 5,858,882
[45] Date of Patent: Jan. 12, 1999

[54] IN-SITU LOW WAFER TEMPERATURE OXIDIZED GAS PLASMA SURFACE TREATMENT PROCESS

[75] Inventors: Liang-Tung Chang; Chih-Cherng Liao, both of Hsinchu, Taiwan

[73] Assignee: Vanguard International Semiconductor Corporation, Hsin-Chu, Taiwan

[21] Appl. No.: 822,664

[22] Filed: Mar. 24, 1997

[51] Int. Cl.$^6$ .................................................. H01L 21/283
[52] U.S. Cl. .......................... 438/761; 438/761; 438/695; 438/631; 438/789; 438/782; 438/626; 438/697; 438/780
[58] Field of Search ..................... 438/761, 695, 438/631, 789, 782, 626, 697, 780

[56] References Cited

U.S. PATENT DOCUMENTS

| | | | |
|---|---|---|---|
| 5,003,062 | 3/1991 | Yen | 437/231 |
| 5,270,267 | 12/1993 | Ouellet | 438/761 |
| 5,334,554 | 8/1994 | Lin et al. | 437/231 |
| 5,556,806 | 9/1996 | Pan et al. | 438/631 |
| 5,635,425 | 6/1997 | Chen | 438/631 |
| 5,679,211 | 10/1997 | Huang | 156/643.1 |

*Primary Examiner*—Charles Bowers
*Assistant Examiner*—Thanh Nguyen
*Attorney, Agent, or Firm*—George O. Saile; Stephen B. Ackerman; Rosemary L. S. Pike

[57] ABSTRACT

A method of forming an interlevel dielectric layer without peeling or cracking in the fabrication of an integrated circuit device is described. Semiconductor device structures are provided in and on a semiconductor substrate. An insulating layer is provided overlying the semiconductor device structures and a first conducting layer is provided overlying the insulating layer and extending down through the insulating layer to contact one of the semiconductor device structures. A first dielectric layer is deposited overlying the first conducting layer. A spin-on-glass layer is coated over the first dielectric layer and then etched back wherein a polymer builds up on the spin-on-glass surface. The spin-on-glass layer is treated with an oxygen plasma treatment wherein the treatment neutralizes the polymer buildup and prevents cracking and peeling of the spin-on-glass layer. A TEOS layer is deposited overlying the spin-on-glass layer to complete the interlevel dielectric layer. A via opening is etched through the interlevel dielectric layer to the first conducting layer. A second conducting layer is deposited within the via opening and patterned to complete the fabrication of the integrated circuit device.

16 Claims, 6 Drawing Sheets

IN-SITU LOW WAFER TEMPERATURE OXIDIZED GAS PLASMA SURFACE TREATMENT PROCESS

BACKGROUND OF THE INVENTION

1. Field of the Invention

The present invention relates to the fabrication of integrated circuit devices, and more particularly, to a method of reducing peeling and cracking of the dielectric layer over a spin-on-glass layer, especially along the wafer edge, in the fabrication of integrated circuits.

2. Description of the Prior Art

Typically, a spin-on-glass (SOG) layer is used to planarize the underlying layers before a dielectric layer such as tetraethoxysilane (TEOS) is deposited. Via openings are made through the TEOS and SOG layers to underlying conductive layers to be contacted. Referring to FIG. 1A, it has been observed that cracks 62 appear especially at the edge of the wafer 5 where the clamping ring holds the wafer in place during etching. The cracking results in peeling of the SOG and TEOS layers and in the presence of trace particles. During the SOG etchback process, CHF polymer buildup occurs especially along the clamping fingers. During subsequent TEOS deposition, pinholes are formed where the polymer has been built up and an organic rich $C_xH_x$ oxide layer is formed at the SOG/TEOS interface. During wet chemical etching to form a via opening, $C_xH_x$ has a very high etch rate so that the wet chemical etchant will punch through the pinholes and the organic rich oxide layer. The organic layer will be etched away leaving the wet chemical etchant at the SOG/TEOS interface. During high temperature sputter deposition of metal to fill the via opening, the wet chemical etchant becomes a vapor which will lift off the TEOS film. Portions of the wafer that are cracked 62 can break when the wafer is again clamped for sputtering of the conducting layer. As illustrated in FIG. 1B, the wafer is broken at crack 63. Trace particles 65 are scattered over the wafer surface.

U.S. Pat. No. 5,003,062 to Yen teaches forming a spin-on-glass sandwich using multiples SOG layers that are baked and vacuum degassed after each deposition to prevent outgassing and cracking of the SOG layers. U.S. Pat. No. 5,334,554 to Lin et al teaches using a nitrogen plasma treatment on the silicon oxide layer underlying the SOG layer in order to prevent a positive charge build up between the SOG and other dielectric layers. U.S. Pat. No. 5,270,267 to Ouellet teaches curing the SOG layers in a plasma which causes an electric field in the SOG film so as to form a film that is very stable in moist air or in water.

SUMMARY OF THE INVENTION

Accordingly, it is a primary object of the invention to provide a process for reducing peeling and cracking of the dielectric layer in the fabrication of integrated circuits.

It is a further object of the invention to provide a process for reducing peeling and cracking of a dielectric layer over a spin-on-glass layer in the fabrication of integrated circuits.

In accordance with the objects of the invention, a method of forming an interlevel dielectric layer without peeling or cracking in the fabrication of an integrated circuit device is achieved. Semiconductor device structures are provided in and on a semiconductor substrate. An insulating layer is provided overlying the semiconductor device structures and a first conducting layer is provided overlying the insulating layer and extending down through the insulating layer to contact one of the semiconductor device structures. A first dielectric layer is deposited overlying the first conducting layer. A spin-on-glass layer is coated over the first dielectric layer and then etched back wherein a polymer builds up on the spin-on-glass surface. The spin-on-glass layer is treated with an oxygen plasma treatment wherein the treatment neutralizes the polymer buildup and prevents cracking and peeling of the spin-on-glass layer. A TEOS layer is deposited overlying the spin-on-glass layer to complete the interlevel dielectric layer. A via opening is etched through the interlevel dielectric layer to the first conducting layer. A second conducting layer is deposited within the via opening and patterned to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 2:
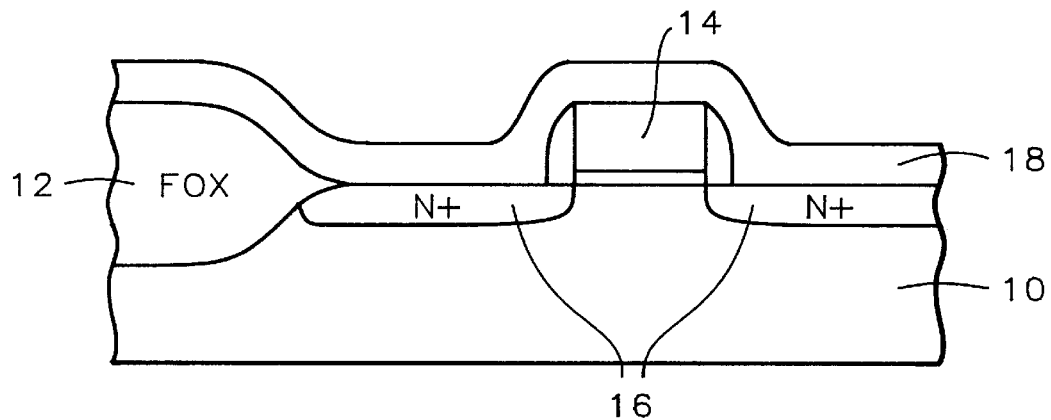
FIGS. 2 through 6 are cross-sectional representations of a preferred embodiment of the present invention.

Referring now more particularly to FIG. 2, there is shown a semiconductor substrate 10. Active areas are isolated from one another by, for example, field oxide regions 12. Semiconductor device structures are formed within the active areas of the substrate. These device structures may include polysilicon gate electrodes 14 and source and drain regions 16.

An oxide layer 18 is deposited overlying the semiconductor device structures. This oxide layer may be TEOS and oxygen deposited to a thickness of between about 800 and 3000 Angstroms.

Figure 3:
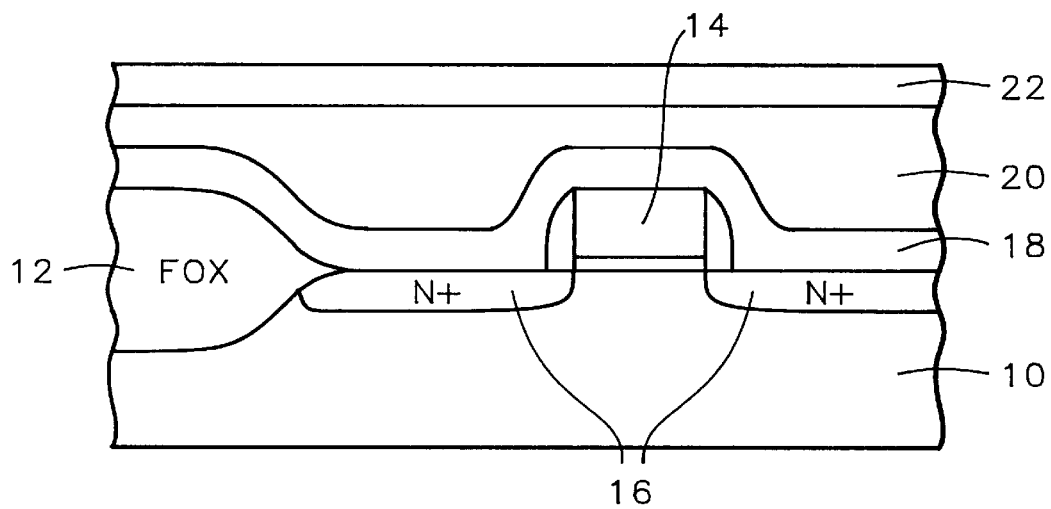

Referring now to FIG. 3, an insulating layer 20 is formed over oxide layer 18. This layer 20 may be an oxide deposited by low pressure chemical vapor deposition (LPCVD) or borophosphosilicate glass (BPSG), or the like. A capping layer 22 of silicon oxide, for example, is deposited overlying the insulating layer 20.

Figure 4:
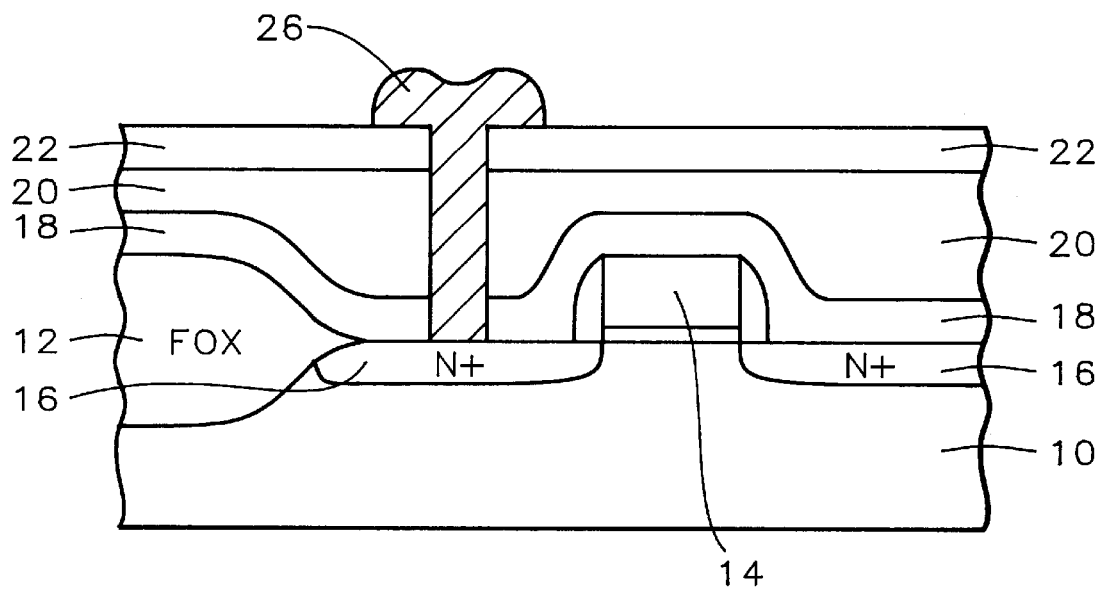

Referring now to FIG. 4, a via opening is made through the dielectric layers 22,20,18 to the underlying region to be contacted, such as source/drain region 16, as shown. A conducting layer 26, such as aluminum or an aluminum alloy is deposited within the via opening and patterned to form the first conducting layer.

Figure 5:
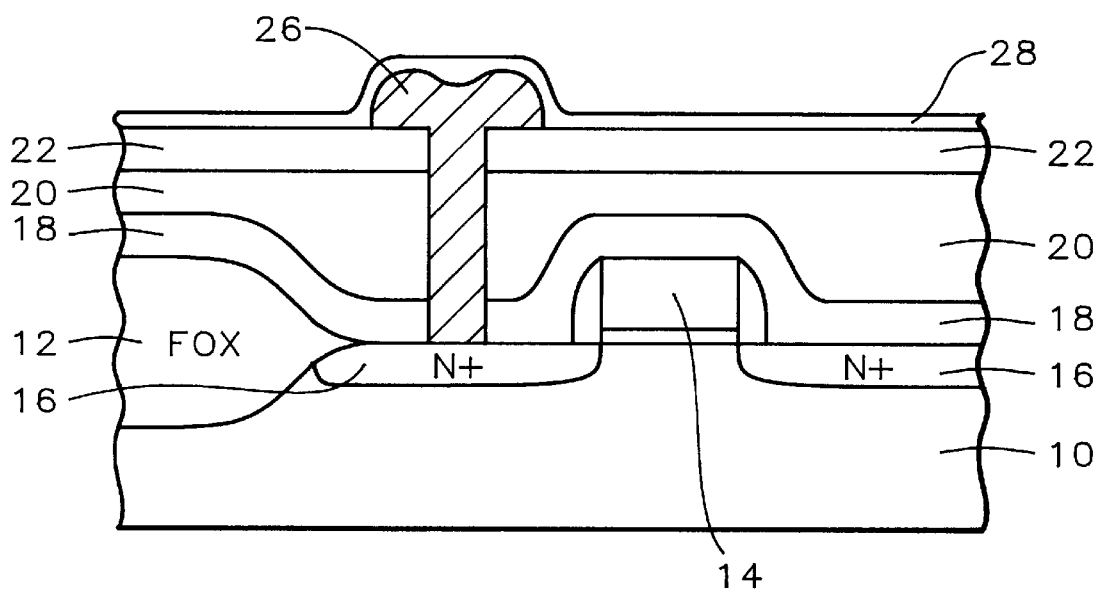

Now, the interlevel dielectric layer is to be formed. An oxide layer 28 is formed over the surface of the substrate, as shown in FIG. 5. This may be formed by plasma enhanced chemical vapor deposition of $SiH_4$ oxide.

Figure 6:
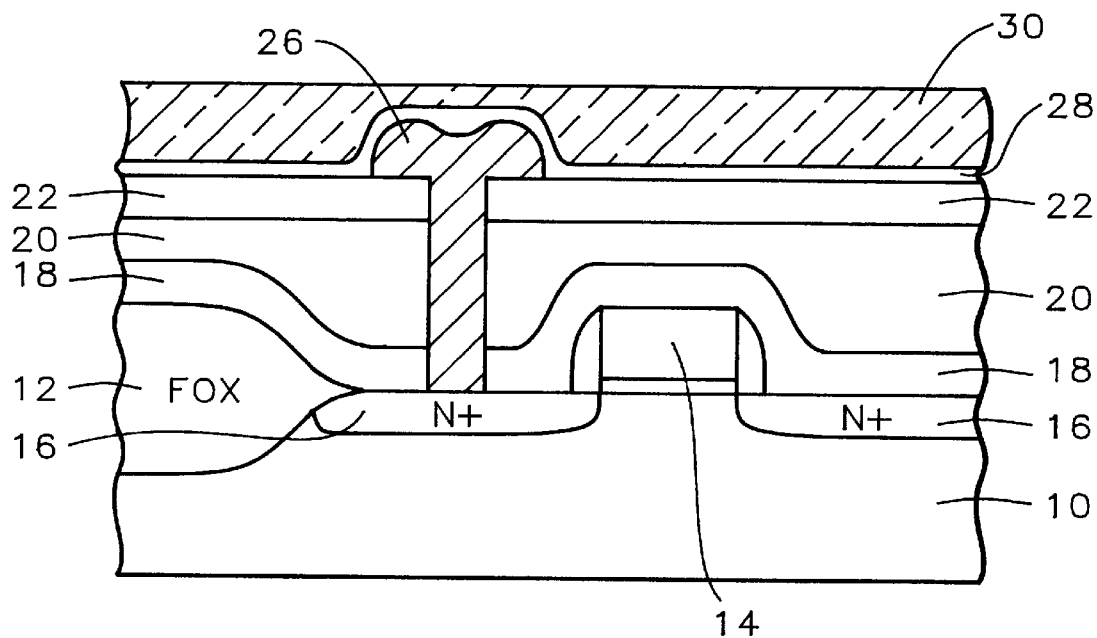

Next, referring to FIG. 6, a spin-on-glass (SOG) layer 30 is formed over the oxide layer 28. The spin-on-glass material may be a silicate or a siloxane material. The spin-on-glass material suspended in a vehicle or solvent is deposited onto the semiconductor wafer surface and uniformly spread thereover by the action of spinning the wafer. The material fills the indentations in the integrated circuit wafer surface. Most of the vehicle or solvent is driven off by a low temperature baking step. The spin-on-glass layer 30 may be formed of multiple spin-on-glass layers. After the spin-on-glass layer 30 has been completely deposited, it is cured as is conventional in the art.

Figure 1A:
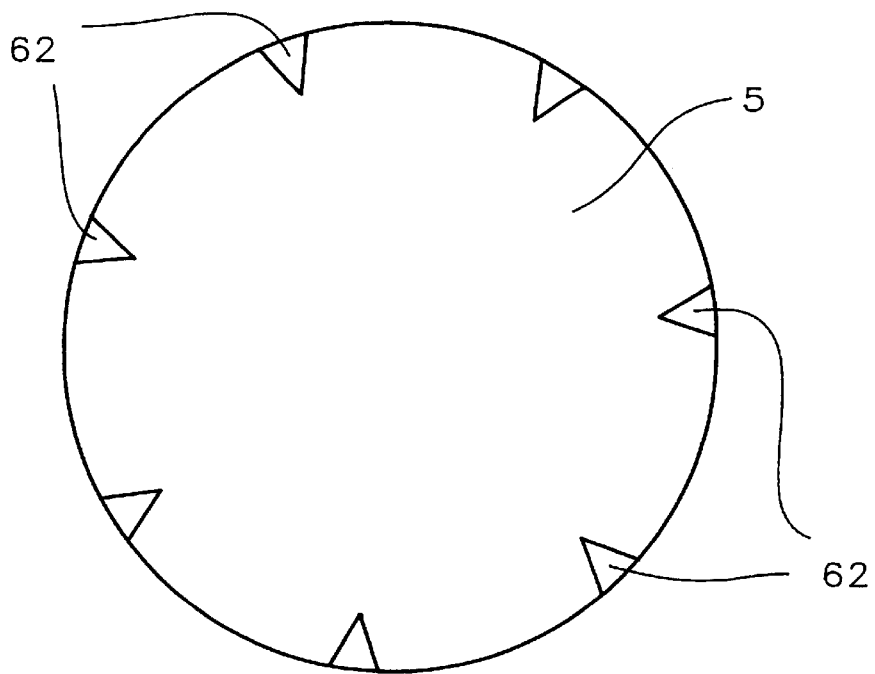
FIGS. 1A and 1B are top views of a wafer showing cracking and particles problems of the prior art.
Figure 7:
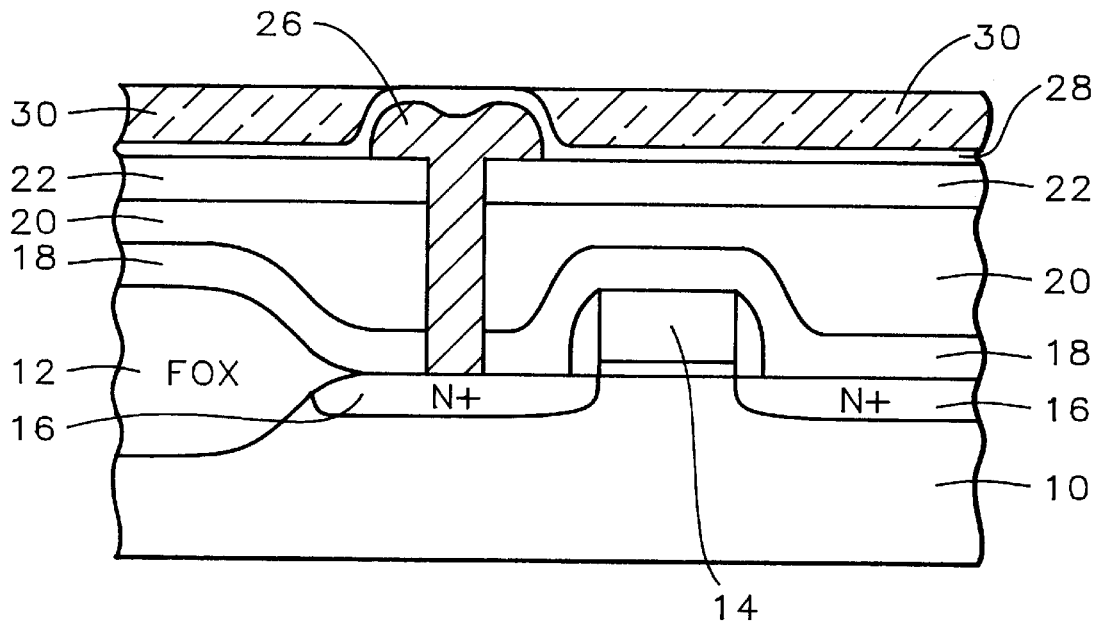
FIG. 7 is a cross-sectional representation of a TEOS deposition chamber.
Figure 8:
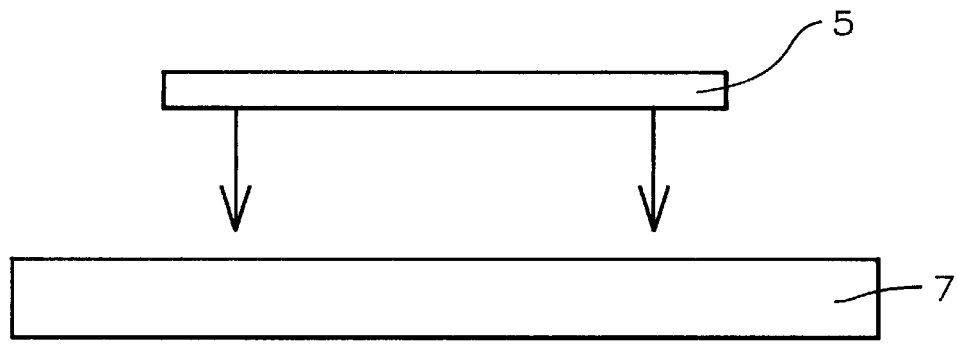
FIGS. 8 through 11 are cross-sectional representations of a preferred embodiment of the present invention.

After the spin-on-glass layer is complete, it is etched back, as shown in FIG. 7. During etchback, the wafer is held in place by a clamping ring. As described hereinabove, CHF polymer will build up especially around the clamping fingers during etchback. In the conventional process after etchback, the final layer of the interlevel dielectric layer, typically a TEOS layer, is deposited at a temperature of about 400° C. The wafer is put into the TEOS deposition chamber and positioned onto the susceptor using, for example, a four point fingers tool. FIG. 8 illustrates the wafer 5 and the susceptor 7. The wafer is clamped to the susceptor and the TEOS deposition is performed. As discussed hereinabove and as illustrated in FIG. 1A, cracks 62 appear on the wafer edge due to this clamping.

In an effort to prevent the cracking of the spin-on-glass layer during TEOS deposition, an $O_2$ plasma treatment of the SOG layer has been performed. However, when the $O_2$ plasma treatment is performed at the TEOS deposition temperature of about 400° C., the CH polymer on the spin-on-glass surface reacts with the TEOS, a CH gas, to form a carbon-like polymer on the SOG layer. This polymer cannot be removed easily after this high temperature formation.

The key feature of the present invention is to perform a low temperature $O_2$ plasma treatment on the spin-on-glass layer before TEOS deposition. In the process of the invention, the $O_2$ plasma treatment is performed while the wafer is being lowered onto the susceptor using the four point fingers tool, for example. When the wafer is in a position above the susceptor, the $O_2$ plasma is flowed into the chamber at the rate of between about 100 and 5000 sccm. The radio frequency is preferred to be between about 10 to 200 watts. Pressure is not important, but TEOS deposition pressure is up to about 9 Torr. It is critical that the temperature during the $O_2$ plasma treatment be a low temperature; that is, between about 50° and 250° C. The treatment is performed for between about 2 to 10 seconds and preferably for about 5 seconds, during which time the wafer is positioned onto the susceptor and the fingers tool is removed. The $O_2$ plasma flow is stopped. Following the $O_2$ plasma treatment, the TEOS layer is deposited at a temperature of about 400° C. The TEOS layer 32 is illustrated in FIG. 9.

The $O_2$ plasma treatment of the present invention removes the polymer build up on the surface of the SOG layer. The $O_2$ plasma links with the CH polymer on the SOG surface thereby preventing the polymer from cross linking with the TEOS to form pinholes.

Figure 9:
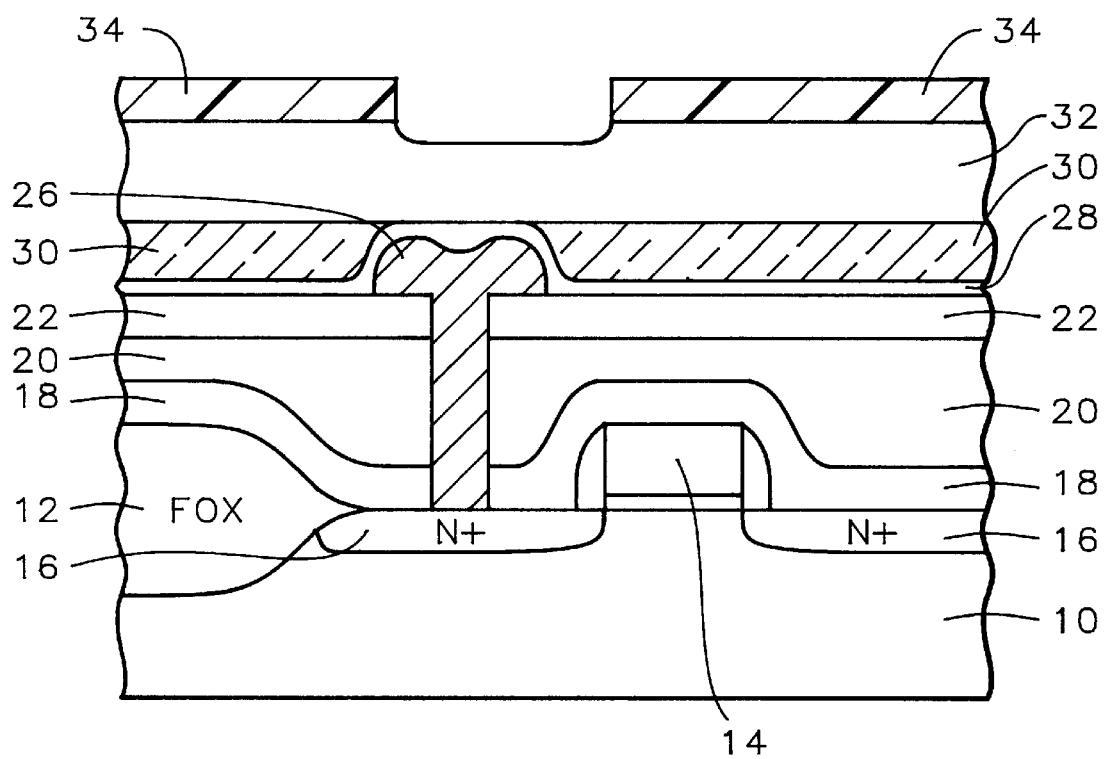
Figure 10:
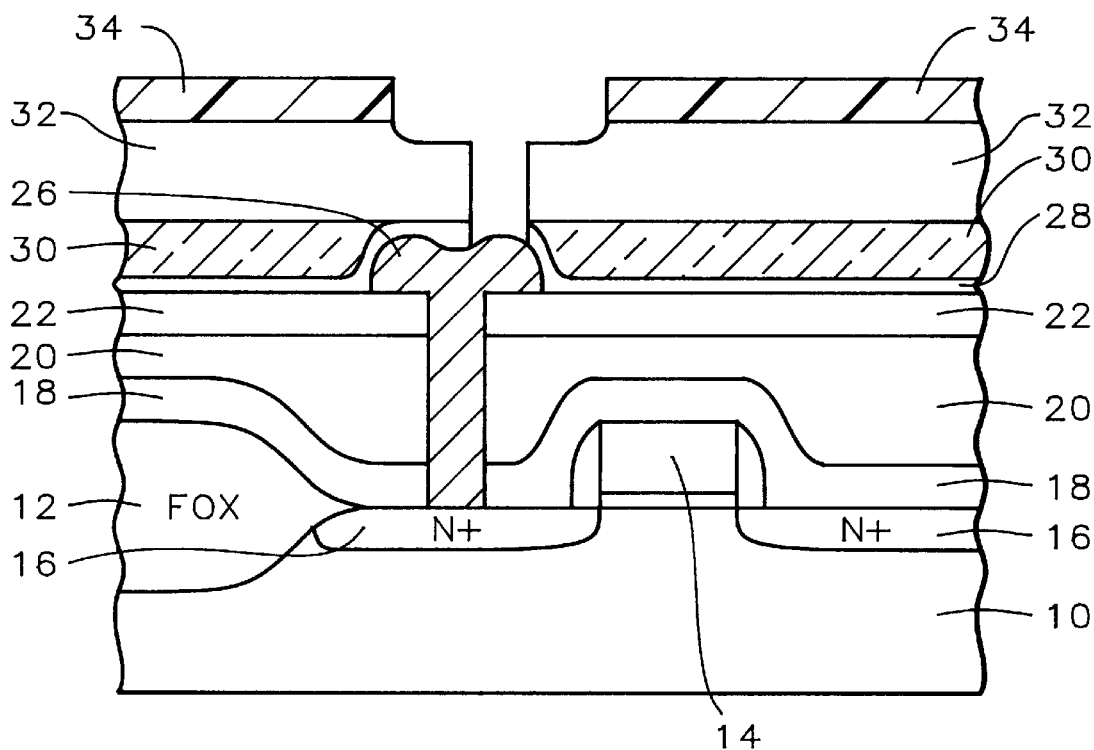

Referring now to FIG. 9, a photoresist mask 34 is formed over the surface of the substrate having openings where via openings are to be formed. Typically, the via opening is formed by a first isotropic wet etch which partially etches the TEOS layer 32, as shown in FIG. 9. In the prior art, this wet etching would punch through the pinholes and etch away the polymer on the SOG/TEOS interface, leaving the wet chemical etchant there. But in the process of the invention, the polymer buildup was removed before the TEOS deposition; therefore, no pinholes were formed. Next, an anisotropic etch etches through the remaining TEOS layer 32 and through the oxide layer 28 to expose a portion of the first metal layer to be contacted, as illustrated in FIG. 10.

Figure 1B:
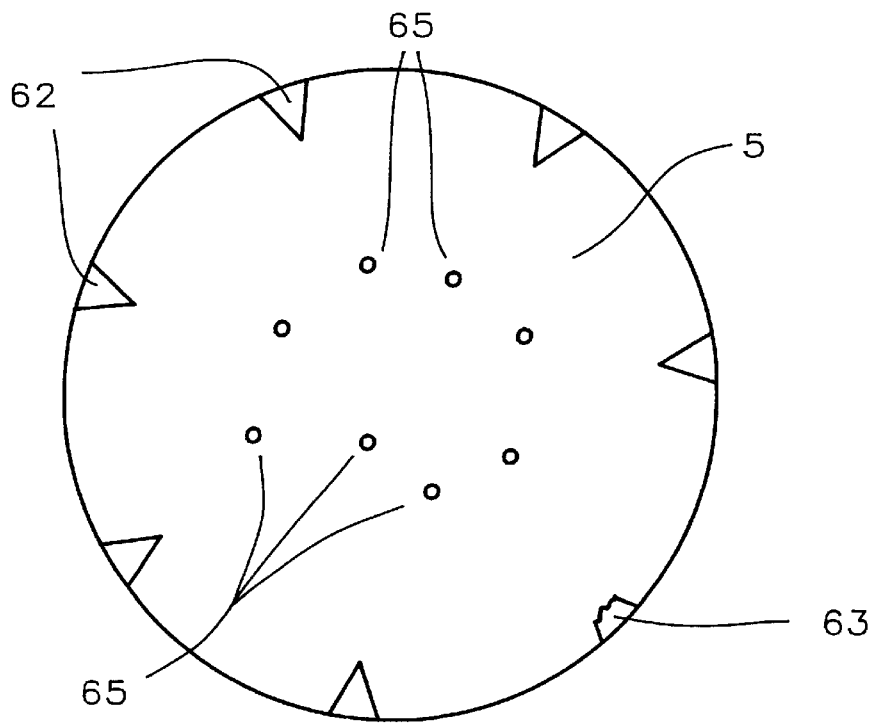
Figure 11:
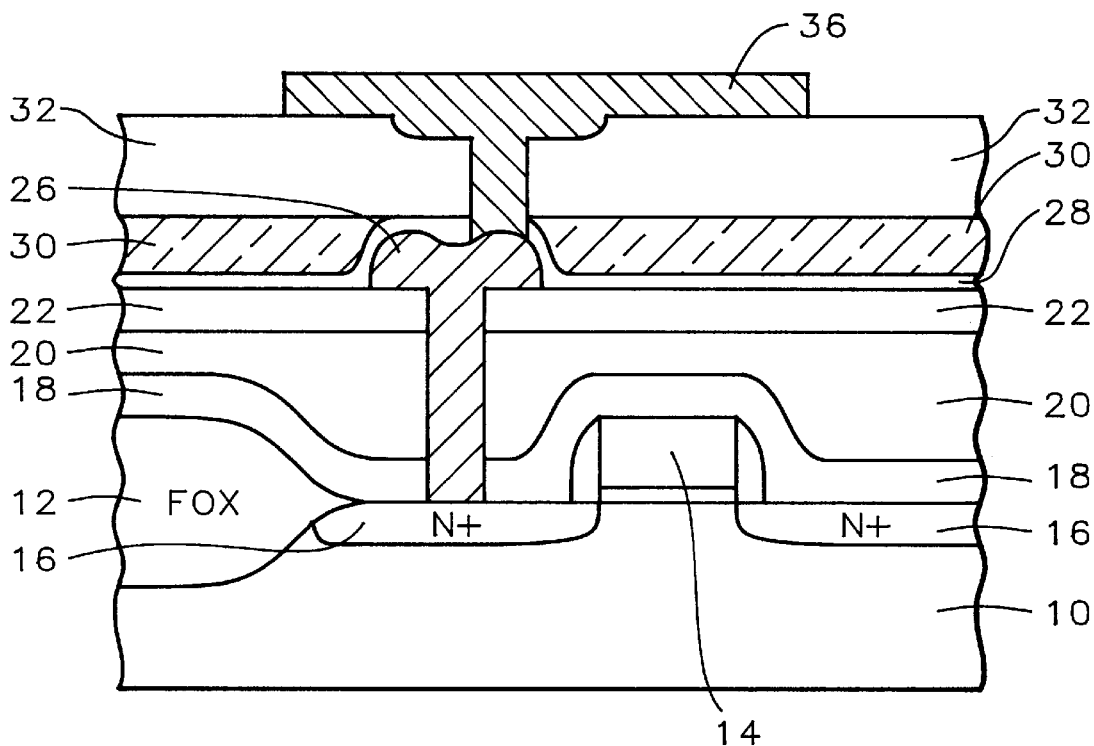

Referring to FIG. 11, a conducting layer 36, such as aluminum or AlCu, or the like, is sputter deposited and patterned to complete the electrical connections of the integrated circuit device. In the prior art, during the high temperature sputter deposition of the metal layer 36, the wet chemical etchant left behind on the SOG/TEOS interface would be changed to a vapor causing the overlying TEOS layer to peel off. However, in the process of the invention, no pinholes are formed so the integrity of the SOG/TEOS interface is maintained. No peeling or cracking of the TEOS layer occurs. Because there is no cracking, there is no particle contamination of the kind illustrated in FIG. 1B caused by breaking at the cracks.

The process of the invention results in a robust interlevel dielectric layer without peeling or cracking of the spin-on-glass and TEOS layers. The oxygen plasma treatment can be performed as the wafer is being positioned onto the susceptor for TEOS deposition. The oxygen treatment must be completed at a low temperature before the temperature is increased for TEOS deposition.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing semiconductor device structures in and on a semiconductor substrate;

providing an insulating layer overlying said semiconductor device structures and a first conducting layer overlying said insulating layer and extending down through said insulating layer to contact one of said semiconductor device structures;

forming an interlevel dielectric layer comprising:
depositing a first dielectric layer overlying said first conducting layer;
coating a spin-on-glass layer over said first dielectric layer;
etching back said spin-on-glass layer wherein a polymer build up is formed on the spin-on-glass layer; and
in a deposition chamber, first treating said spin-on-glass layer with an oxygen plasma treatment whereby said polymer buildup is removed and thereafter depositing a second dielectric layer overlying said spin-on-glass layer to complete said interlevel dielectric layer;

etching a via opening through said interlevel dielectric layer to said first conducting layer; and depositing and patterning a second conducting layer within said via opening to complete said fabrication of said integrated circuit device.

2. A method according to claim 1 wherein said first dielectric layer comprises silicon oxide deposited by plasma enhanced chemical vapor deposition.

3. A method according to claim 1 wherein said spin-on-glass layer comprises a silicate material.

4. A method according to claim 1 wherein said spin-on-glass layer comprises a siloxane material.

5. A method according to claim 1 wherein said treating said spin-on-glass layer comprises flowing $O_2$ plasma at the rate of between about 100 and 5000 sccm at a temperature of between about 50° and 250° C. for between about 2 to 10 seconds.

6. A method according to claim 1 wherein said second dielectric layer comprises TEOS deposited at a temperature of about 400° C.

7. A method of forming an interlevel dielectric layer without peeling or cracking in the fabrication of an integrated circuit device comprising:

providing semiconductor device structures in and on a semiconductor substrate;

providing an insulating layer overlying said semiconductor device structures and a first conducting layer overlying said insulating layer and extending down through said insulating layer to contact one of said semiconductor device structures;

depositing a first dielectric layer overlying said first conducting layer;

coating a spin-on-glass layer over said first dielectric layer;

etching back said spin-on-glass layer wherein a polymer buildup is formed on said spin-on-glass layer; and in a deposition chamber, first treating said spin-on-glass layer with an oxygen plasma treatment at a first temperature of between about 50° and 250° C. wherein said treatment removes said polymer buildup and thereby prevents cracking and peeling of said spin-on-glass layer and thereafter depositing a second dielectric layer overlying said spin-on-glass layer at a second temperature of about 400° C. to complete said interlevel dielectric layer in said fabrication of said integrated circuit device.

8. A method according to claim 7 wherein said first dielectric layer comprises silicon oxide deposited by plasma enhanced chemical vapor deposition.

9. A method according to claim 7 wherein said spin-on-glass layer comprises a silicate material.

10. A method according to claim 7 wherein said spin-on-glass layer comprises a siloxane material.

11. A method according to claim 7 wherein said treating said spin-on-glass layer comprises flowing $O_2$ plasma at the rate of between about 100 and 5000 sccm at a temperature of between about 50° and 250° C. for between about 2 to 10 seconds.

12. A method according to claim 7 wherein said second dielectric layer comprises TEOS deposited at a temperature of about 400° C.

13. A method of forming an interlevel dielectric layer without peeling or cracking in the fabrication of an integrated circuit device comprising:

providing semiconductor device structures in and on a semiconductor substrate;

providing an insulating layer overlying said semiconductor device structures and a first conducting layer overlying said insulating layer and extending down through said insulating layer to contact one of said semiconductor device structures;

depositing a first dielectric layer overlying said first conducting layer;

coating a spin-on-glass layer over said first dielectric layer;

etching back said spin-on-glass layer wherein a polymer is formed on said spin-on-glass layer;

in a deposition chamber, first treating said spin-on-glass layer with an oxygen plasma treatment comprising flowing $O_2$ gas at between about 100 and 5000 sccm at a temperature of between about 50° and 250° C. for between about 2 to 10 seconds wherein said treatment removes said polymer and thereby prevents cracking and peeling of said spin-on-glass layer and thereafter depositing a TEOS layer overlying said spin-on-glass layer at a temperature of about 400° C. to complete said interlevel dielectric layer;

etching a via opening through said interlevel dielectric layer to said first conducting layer; and depositing and patterning a second conducting layer within said via opening to complete said fabrication of said integrated circuit device.

14. A method according to claim 13 wherein said first dielectric layer comprises silicon oxide deposited by plasma enhanced chemical vapor deposition.

15. A method according to claim 13 wherein said spin-on-glass layer comprises a silicate material.

16. A method according to claim 13 wherein said spin-on-glass layer comprises a siloxane material.

* * * * *